United States Patent
Chandler et al.

(10) Patent No.: US 7,266,009 B2
(45) Date of Patent: Sep. 4, 2007

(54) FERROELECTRIC MEMORY

(75) Inventors: Trevis Chandler, Brantford (CA); Ali Sheikholeslami, Toronto (CA); Shoichi Masui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/188,104

(22) Filed: Jul. 25, 2005

(65) Prior Publication Data

US 2006/0083049 A1    Apr. 20, 2006

Related U.S. Application Data

(63) Continuation of application No. PCT/JP03/06601, filed on May 27, 2003.

(51) Int. Cl.
*G11C 11/22* (2006.01)
(52) U.S. Cl. .................. 365/145; 365/203; 365/189.01
(58) Field of Classification Search ................ 365/145, 365/203, 189.01
See application file for complete search history.

(56) References Cited

U.S. PATENT DOCUMENTS 6,038,161 A *  3/2000  Fuchikami ................. 365/145
6,525,956 B2   2/2003  Murakuki
6,914,839 B2 *  7/2005  Chow et al. ................. 365/207
6,924,997 B2 *  8/2005  Chen et al. .................. 365/145

FOREIGN PATENT DOCUMENTS

| JP | 11-185465 | 7/1999 |
| JP | 2002-32984 A1 | 1/2002 |
| JP | 2002-157876 A1 | 5/2002 |

OTHER PUBLICATIONS

Eslami et al., "A Differential-Capacitance Read Scheme for FeRAMs", 2002 Symposium on VLSI Circuits Digest of Technical Papers, 15-13, pp. 298-301 (Jun. 2002).

* cited by examiner

*Primary Examiner*—David Lam
(74) *Attorney, Agent, or Firm*—Arent Fox, LLP

(57) ABSTRACT

For a predetermined period from the start of a read operation, an electric current is fed to bit lines connected with memory cells so that ferroelectric capacitors of the memory cells are charged. The voltage change of the bit lines are different according to the logic values of data stored in the ferroelectric capacitors. Therefore, the logic value stored in the memory cells can be detected as a time difference. Even if the voltage change of the bit lines is small, the time difference can be reliably generated. Even in case the residual dielectric polarization value of the ferroelectric capacitor is low, therefore, the data can be reliably read from the memory cells. In short, the read margin of data can be better improved than in the case where the logic value of data is detected with a voltage difference.

26 Claims, 12 Drawing Sheets

FERROELECTRIC MEMORY

CROSS REFERENCE TO RELATED APPLICATION

This application is a continuation application of International Application PCT/JP03/06601, filed on May 27, 2003, and designating the U.S.

BACKGROUND OF THE INVENTION

1. Field of the Invention

The present invention relates to a ferroelectric memory having capacitors composed of ferroelectric films.

2. Description of the Related Art

As the semiconductor memory device having the advantages of all of a DRAM, a flash-memory, and an EEPROM, there has been developed a ferroelectric memory, which has memory cells provided with ferroelectric capacitors. The ferroelectric memory is enabled to hold data even if not fed with a power supply, by operating the ferroelectric capacitors made of an insulating material as a ferroelectric substance, as a variable capacitor and by utilizing the fact that a residual dielectric polarization is left even if the applied voltage to the ferroelectric capacitors is zero. The ferroelectric capacitors can be made of either a ferroelectric material composed mainly of PZT (lead zirconate titanate) or a ferroelectric material having a bismuth layer type perovskite structure such as SBT (strontium bismuth tantalate).

1T1C type cells and 2T2C type cells exist as the memory cells of the ferroelectric memory. The 1T1C type cell is composed of one transfer transistor and one ferroelectric capacitor for holding information of 1 bit. The 1T1C type cell is adopted in the ferroelectric memory for applications of a large capacity, because it can reduce the size of the memory cell. The 2T2C type cell is composed of two transfer transistors and two ferroelectric capacitors for holding information of 1 bit. The 2T2C type cell can enlarge a read margin, because complementary data are stored in the two ferroelectric capacitors. Therefore, the 2T2C type cell is adopted in the ferroelectric memory for applications of a high reliability.

The ferroelectric capacitor of the aforementioned ferroelectric memory has its one end connected with the bit line through a transfer transistor and its other end connected with the plate line. In the read operation of the 2T2C type ferroelectric memory, for example, when the plate line is driven, the voltage difference of the bit line pair changes according to the difference of the effective capacitance of the ferroelectric capacitor pair stored with the complementary data. The voltage difference of the bit line pair is amplified by a sense amplifier and is outputted as read data. The read scheme of this kind is called the "plate line drive scheme".

The plate line is commonly connected with the numerous ferroelectric capacitors so that the load capacitance is high. In the read operation, therefore, the plate line drive scheme accompanied by a large CR delay has a defect that the read access time becomes long.

In order to shorten the read access time, the inventors of the present application plus others have proposed a scheme (i.e., a differential-capacitance read scheme) for reading the differential-capacitance of the ferroelectric capacitor as data without driving the plate line (Y. Eslami, A. Sheikholeslami, S. Masui, T. Endo, and S. Kawashima, "A differential-Capacitance Read Scheme for FeRAMs", Digests of Technical Papers of 2002 Symposium on VLSI Circuits, pp. 298-301).

FIG. 1 shows a summary of the differential-capacitance read scheme type read circuit utilizing the 2T2C type ferroelectric memory cells.

A memory cell MC includes transfer transistors M1 and M2 made of nMOS transistors, and ferroelectric capacitors FC1 and FC2. The ferroelectric capacitor FC1 has its one end connected with a bit line BL through the transfer transistor M1 and its other end connected with a plate line PL. The ferroelectric capacitor FC2 has its one end connected with a bit line XBL through the transfer transistor M2 and its other end connected with the plate line PL. The gates of the transfer transistors M1 and M2 are connected with a word line WL. Arrows attached to the ferroelectric capacitors FC1 and FC2, as shown, indicate a polarization state. The upward arrow indicates the state, in which the "logic 0" is stored. The downward arrow indicates the state, in which the "logic 1" is stored.

A sense amplifier SA includes a pair of CMOS inverters having their inputs and outputs connected with each other, and a pair of pMOS transistors P10 and P11. The pMOS transistor P10 has its source, drain and gate connected with a power supply line VDD, the bit line BL and the output CSC (as will also be called the "CSC signal") of the power supply source, respectively. The pMOS transistor P11 has its source, drain and gate connected with the power supply line VDD, the bit line XBL and the output CSC of the current source, respectively. The pMOS transistors P10 and P11 operate as current sources for feeding electric currents to bit line pairs BL and XBL, respectively.

FIG. 2 shows a hysteresis loop of the ferroelectric capacitor pairs FC1 and FC2 shown in FIG. 1.

When the plate line is driven from a low level to a high level so that a voltage V1 is applied between the two ends of the ferroelectric capacitor, the ferroelectric capacitor FC1 stored with the "logic 0" is not accompanied by a polarization inversion so that the effective capacitance C0 becomes small. On the contrary, the ferroelectric capacitor FC2 stored with the "logic 1" is accompanied by the polarization inversion so that the effective capacitance C1 becomes large. By the drive of the plate line PL, voltages corresponding to electric charges Q0 and Q1 are generated on the bit lines BL and XBL.

FIG. 3 shows the read operation of the 2T2C type ferroelectric capacitor shown in FIG. 1.

In the read operation, the bit lines BL and XBL are first precharged to a ground voltage VSS. When a read command is fed so that the word line WL is selected in response to an address signal, the ferroelectric capacitors FC1 and FC2 are connected with the bit lines BL and XBL, respectively.

After this, the output CSC of the current source, which is pulled up to the power supply voltage VDD, is set to a DC voltage value (at a low level). In response to the change of the CSC signal to the low level, the bit lines BL and XBL are fed with electric currents of the same quantity through the pMOS transistors P10 and P11. At this time, the rising rates of the bit lines BL and XBL are different according to the effective capacitances of the ferroelectric capacitors FC1 and FC2. Specifically, the bit line BL, which is connected with the ferroelectric capacitor FC1 having an effectively smaller capacitance, rises earlier than the bit line XBL which is connected with the ferroelectric capacitor FC2 having an effectively larger capacitance.

The voltages of the bit lines BL and XBL continue rising while the CSC signal is at the low level. After a sufficient voltage difference was built up between the bit lines BL and XBL, the CSC signal changes again to the power supply voltage VDD so that the current source composed of the pMOS transistors P10 and P11 is turned OFF. After this, power supplies SAP and SAN of sense amplifiers SAP and SAN change to the high level and the low level, respectively, thereby to activate the sense amplifier SA. In response to this activation of the sense amplifier SA, the voltage of the bit line BL rises to the voltage (e.g., the power supply voltage VDD) of the power supply SAP of the sense amplifier, and the voltage of the bit line XBL falls to the voltage (e.g., the ground voltage VSS) of the power supply SAN of the sense amplifier. During the activation of the sense amplifier SA, the plate line PL is driven so that the original data are written back in the ferroelectric capacitors FC1 and FC2. After this, the word line WL is unselected, and the read operation is completed.

In the differential-capacitance read scheme, as shown in FIG. 3, the plate line PL is driven after the data were read from the ferroelectric capacitors FC1 and FC2. Independently of the CR delay time of the plate line, therefore, the data can be read from the memory cell MC to the bit lines BL and XBL. Therefore, it is possible to shorten the data reading time (i.e., the time from the read command to the output of the read data). Specifically, the data reading time is made shorter by about 40% than that of the plate line drive scheme.

FIG. 4 shows a summary of a read circuit of a differential-capacitance read scheme utilizing the 1T1C type ferroelectric memory cell. The sense amplifier SA is identical to the sense amplifier SA shown in FIG. 1.

Each memory cell MC includes the transfer transistor M1 made of an nMOS transistor, and the ferroelectric capacitor FC1. This ferroelectric capacitor FC1 has its one end connected with a bit line BLE or a bit line BLO through the transfer transistor M1 and its other end connected with the plate line PL. The gates of the transfer transistors M1 of the memory cells MC are individually connected with different word lines WLE and WLO. In other words, the memory cells MC, which are individually connected with the complementary bit lines BLE and BLO, are not simultaneously accessed to.

A reference memory cell RMC includes: a reference capacitor composed of the same four ferroelectric capacitors C0 and C1 as the ferroelectric capacitor FC1 of the memory cell MC; and two nMOS transistors N10 and N11. When a reference word line RWLO is at the high level, the nMOS transistor N10 connects the reference capacitor with the bit line BLE. When a reference word line RWLE is at the high level, the nMOS transistor N11 connects the reference capacitor with the bit line BLO.

The reference capacitor is constituted by connecting the two capacitor pairs, in which the ferroelectric capacitor C0 for storing the "logic 0" and the ferroelectric capacitor C1 for storing the "logic 1" are connected in series, in parallel with each other. The capacitance of the reference capacitor is (C0+C1)/2. In other words, the reference capacitor has an intermediate capacitance between the capacitance of the ferroelectric capacitor FC1 for storing the "logic 0" and the capacitance of the ferroelectric capacitor FC1 for storing the "logic 1". The reference capacitor is configured by combining the same plural ferroelectric capacitors as the memory cell capacitors, so that the intermediate capacitance can be made simple and highly precise.

In the 1T1C type ferroelectric memory shown in FIG. 4, in case the word line WLE takes the high level so that the memory cell MC connected with the bit line BLE is selected, the reference word line RWLE takes the high level so as to connect the reference capacitor with the bit line BLO. Likewise, in case the word line WLO takes the high level so that the memory cell MC connected with the bit line BLO is selected, the reference word line RWLO takes the high level so as to connect the reference capacitor with the bit line BLE. Like FIG. 3, as has been described hereinbefore, the difference between the voltage of the bit line BLE (or BLO) changing according to the capacitance of the ferroelectric capacitor FC1 and the voltage of the bit line BLO (or BLE) changing according to the capacitance of the reference capacitor is amplified by the sense amplifier SA and is outputted as the read data.

The differential-capacitance read scheme can shorten the read access time more than the plate line drive scheme. However, it is demanded to make the read access time shorter.

In the 1T1C type differential-capacitance read scheme, the reference memory cell is configured by using a plurality of ferroelectric capacitors. In the ferroelectric capacitors, the relation between the applied voltage and the capacitance is nonlinear, as shown by the hysteresis loop of FIG. 2. Specifically, the ferroelectric capacitor FC1 stored with the "logic 0" as shown in FIG. 2, and the ferroelectric capacitor FC1 stored with the "logic 1" are different in the change in the capacitance with respect to the change in the applied voltage. In fact, the effective capacitance of the reference memory becomes smaller than (C0+C1)/2. As a result, the read margin of the memory cell MC stored with the "logic 0" becomes smaller than the read margin of the memory cell MC stored with the "logic 1".

The reference memory cell can also be constituted of one ferroelectric capacitor having a larger size than that of the ferroelectric capacitor FC1 of the memory cell. The effective capacitance of the reference memory cell of this kind can be set between the capacitances C0 and C1, as shown in FIG. 2, by writing the "logic 0" in the ferroelectric capacitor. However, the effective capacitance of the reference memory cell is hard to set precisely to (C0+C1)/2. Therefore, the read margin becomes small.

In the ferroelectric memory, on the other hand, the ferroelectric material is deteriorated when the read number (or the rewrite number) exceeds tenth power of 10, so that the shape of the hysteresis loop shown in FIG. 2 changes to reduce a residual dielectric polarization value Q. When the ferroelectric memory is mounted on a printed circuit board, the residual dielectric polarization value Q is temporarily reduced by the influences of thermal fluctuations caused by a soldering process (or a heat treatment). The residual dielectric polarization value Q is allowed to restore the value before the soldering process by a first read operation after the heat treatment.

In the ferroelectric memory (FIG. 4) sharing the reference memory cell between the memory cells MC connected with the plural word lines WLE and WLO, the change in the residual dielectric polarization value Q before and after the heat treatment reduces the read margin. In the first read operation after the heat treatment, the residual dielectric polarization value Q has reduced in both the memory cells MC and in the reference memory cell so that its reductions are offset by each other. Therefore, the read margin hardly drops. In case, however, an access is made in the next read operation to another memory cell MC which has not restored the residual dielectric polarization value Q, the reference memory cell has restored the residual dielectric polarization value Q. Therefore, the read margin has dropped, and the data may be unable to be correctly read.

In the ferroelectric memory (FIG. 4) sharing the reference memory cell between the memory cells MC connected with the plural word lines WLE and WLO, the access time of the reference memory cell is twice at the maximum as many as that of the memory cells MC. Therefore, the material characteristics of the ferroelectric capacitor constituting the reference memory cell are earlier deteriorated than those of the ferroelectric capacitor of the memory cells MC. As a result, the read margin becomes smaller as the read number becomes larger, so that the read number (or the rewrite number) decreases.

In order to prevent the reduction in the read margin in the 1T1C type ferroelectric memory, there has been proposed a technique (Japanese Unexamined Patent Application No. 2002-157876), in which the average of the maximum and the minimum obtained by the read operation of the ferroelectric capacitor is set to the reference voltage. According to this technique, the number of the memory cells MC to be connected with the word lines WL is increased by one, in which the inverted data of the data to be written in the memory cell MC connected with a predetermined bit line are written. In this ferroelectric memory, however, the operation of the sense amplifier cannot be started until the reference voltage is generated from the ferroelectric capacitor. As a result, the access time is delayed.

SUMMARY OF THE INVENTION

An object of the invention is to read data reliably from the memory cells even in case the residual dielectric polarization value of the ferroelectric capacitor is so low that the voltage change in the bit lines is small. Specifically, the object is to maximize the read margins of the data for individual logic values.

Another object of the invention is to retain the read margins of the data, even in case the ferroelectric capacitor is deteriorated, thereby to increase the rewrite number of the data.

Still another object of the invention is to shorten the read cycle time of the ferroelectric memory.

According to one of the aspects of the present invention, a ferroelectric capacitor of a normal memory cell including a first memory cell is stored with data fed from the exterior. A ferroelectric capacitor of a second memory cell is stored with the inverted data of the first data stored in the first memory cell. The effective capacitances of the ferroelectric capacitors are different according to the logic values of write data.

For a predetermined period from the start of a read operation, bit lines to be connected with the memory cells are fed with an electric current so that the ferroelectric capacitors are charged. The voltage of the bit line, which is connected with the ferroelectric capacitor having an effectively small capacitance, rises earlier than the voltage of the bit line which is connected with the ferroelectric capacitor having an effective large capacitance. Therefore, the length of time for the voltages of the bit lines to exceed a threshold voltage is different according to the logic values stored in the ferroelectric capacitors. In other words, the charge times of the ferroelectric capacitors are different according to the logic values of the written data.

The logic values of the data stored in the memory cells can be detected as time differences. A circuit for detecting the time can be more easily formed and has a higher precision than a circuit for detecting the voltage. Therefore, the data can be reliably read by deciding the logic values of the data to be read from the normal memory cells to the bit lines in a predetermined time after the voltage of any of the bit lines connected with the first and second memory cells first exceeded the threshold voltage.

Even with a small voltage change in the bit lines, the time difference can be reliably made. Even in the case of a small residual dielectric polarization value of the ferroelectric capacitors, therefore, the data can be reliably read from the memory cells. In short, the read margins of the data can be improved better than the case where the logic values of the data are detected with the voltage difference. Even in case the ferroelectric capacitors are deteriorated, moreover, the read margins of the data can be retained to increase the rewrite number of the data.

According to another aspect of the present invention, the predetermined time is set to one half of a period from a time when a voltage of one part of the bit lines connected with the first and second memory cells exceeds the threshold voltage to a time when a voltage of the other part of the bit lines connected with the first and second memory cells exceeds the threshold voltage. The predetermined time is set by using a variable delay circuit, for example. The period from the time when the voltage of one bit line exceeds the threshold voltage to the time when the predetermined time elapses is equal to the period from when the predetermined time elapses to the time when the voltage of the other bit line exceeds the threshold voltage. The timing for deciding the logic value of the data is set at the center between the read timings of the two logic values so that the read margins of the data can be maximized individually for the two logic values. In short, the read margins can be improved.

According to another aspect of the present invention, a sense amplifier differentially amplifies the difference between the voltage of each bit line and the threshold voltage, and outputs the amplified difference as read data. In other words, the sense amplifier decides whether or not the bit line exceeds the threshold voltage. The voltage difference (or the difference in the logic values) of the bit lines is converted into the time difference in the transition edges of the read data individually outputted from the sense amplifiers. A latch signal is generated in a predetermined time (i.e., the center of the two transition edges) after the transition edge of the first read data. In short, the latch signal is generated from the read data. The logic level of the read data is latched in response to the latch signal. Therefore, the read margins of the data can be maximized individually for the two logic values.

According to another aspect of the present invention, a difference is detected between a first period from the time when the voltage of one part of the bit lines connected with the first and second memory cells exceeds the threshold voltage to the time when the latch signals are outputted, and a second period from the time when the latch signals are read to the time when the voltage of the other part of the bit lines connected with the first and second memory cells exceeds the threshold voltage. An adjustment signal is outputted to reduce that difference. In case, therefore, the output timing of the latch signals is deviated from the center of the two transition edges, the output timing can be corrected to a correct one by adjusting the delay time of the variable delay circuit.

According to another aspect of the present invention, the delay adjustment circuit includes a counter for reversing a count direction in a case where the first period is longer than the second period, compared to a case where the first period is shorter than the second period. The delay adjustment circuit outputs the counter value of the counter as an adjustment signal. The delay time of the variable delay circuit is adjusted with the adjustment signal. Therefore, the delay time of the variable delay circuit can be easily altered according to the increase/decrease in the counter value.

According to another aspect of the present invention, the variable delay circuit includes: a plurality of load capacitors connected with a generation path of the latch signals; and a switch which connects/disconnects the load capacitors with/from the generation path in accordance with the counter value. Therefore, the output timing of the latch signals can be easily altered by using the counter.

According to another aspect of the present invention, the capacitances of the load capacitors are set to increase twice by twice. Therefore, the capacitances can be increased/decreased at every predetermined value in accordance with the weighting of each bit of a binary counter, for example. As a result, the delay times of the variable delay circuit can be adjusted at regular intervals.

According to another aspect of the present invention, the latch signal is generated in a predetermined time after the voltage of the one part of the bit lines exceeds the threshold voltage. A delayed latch signal is generated by further delaying the latch signal by the predetermined time from the latch signal. The latch signal and the delayed latch signal are individually generated by two variable delay stages which are always set to have equal delay times and which are connected in series, for example. When the difference is eliminated between an output timing of the delayed latch signal and a timing at which the voltage of the other of the bit lines exceeds the threshold voltage, the first and second periods become equal to each other. The delay times of the two variable delay stages connected in series are simultaneously adjusted, so that the first and second periods can be equalized easily and reliably to set the latch signal at the center of the two transition edges.

According to another aspect of the present invention, an early arrival decision circuit of the variable delay circuit selects read data that are earlier outputted, from the read data that are outputted from the sense amplifiers corresponding to the first and second memory cells, and outputs the selected read data to the variable delay stage at the first stage. Therefore, the variable delay stage at the first stage can generate the latch signal on the basis of the read data earlier outputted, independently of the logic values of the data, which are stored in the first and second memory cells.

According to another aspect of the present invention, a late arrival decision circuit of the variable delay circuit selects read data that are later outputted, from the read data that are outputted from the sense amplifiers corresponding to the first and second memory cells, and outputs the selected read data to the delay adjustment circuit. Therefore, the delay adjustment circuit can optimize the output timing of the latch signal on the basis of the read data later outputted, independently of the logic values of the data stored in the first and second memory cells.

According to another aspect of the present invention, a write-back operation to write data read from the memory cells back again in the memory cells starts in response to the latch signal. The write-back operation is executed by driving the plate line which is connected with the ferroelectric capacitor, for example. The write-back operation is started in response to the latch signal generated from the read data, so that the write-back operation can be started early and completed early. Therefore, the read cycle can be shortened.

According to another aspect of the present invention, the predetermined time is set for each read operation. The predetermined time thus set is used in the next read operation. Therefore, even in case the temperature or the power supply voltage fluctuates during the operation of the ferroelectric memory, the latch signal can be set to always be output at the optimal timing.

According to another aspect of the present invention, the bit lines are precharged to a predetermined voltage before the read operation. Therefore, the voltage of the bit lines can be raised while precisely reflecting the effective capacitance of the ferroelectric capacitors of the first and second memory cells. Accordingly, the output timing of the latch signal can be precisely set at the center between the output timing of the preceding read data and the output timing of the succeeding read data. As a result, the read margins of the data can be maximized individually for the two logic values.

According to another aspect of the present invention, a voltage generator generates the threshold voltage. The threshold voltage is generated in the ferroelectric memory so that it can be easily generated at a desired value.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
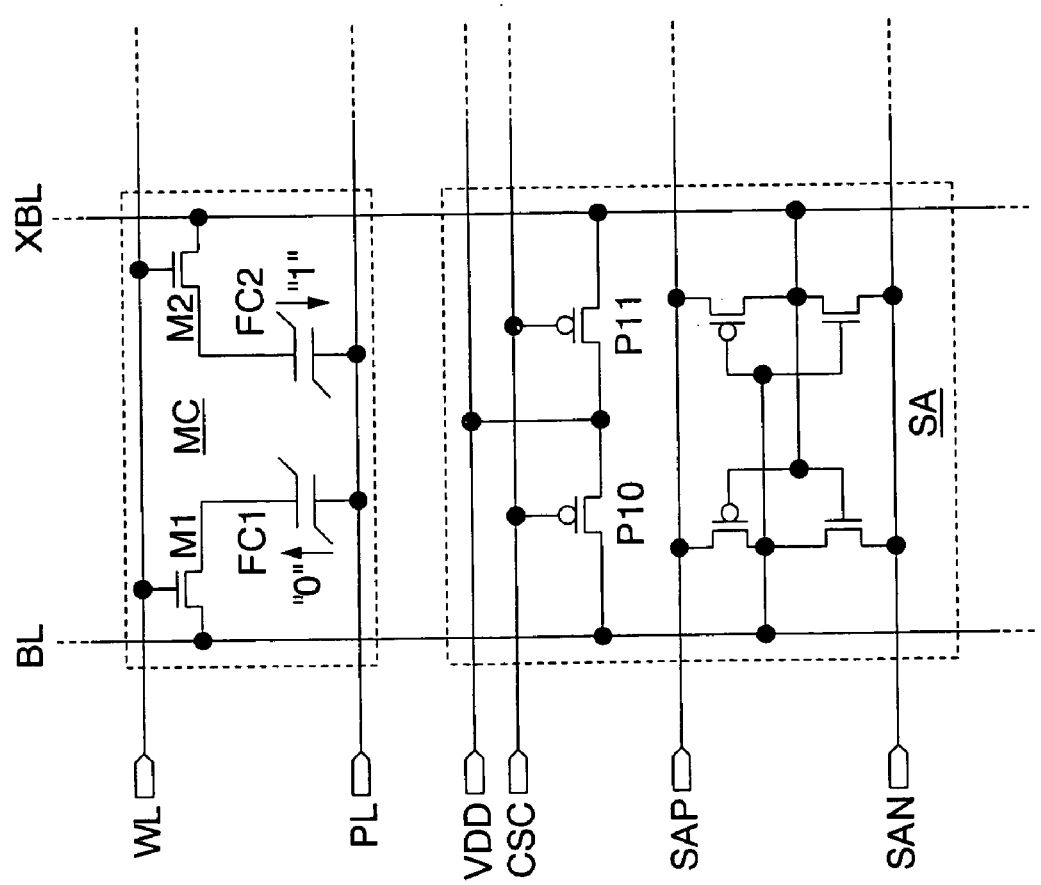
FIG. 1 is a circuit diagram showing a summary of a read circuit of a differential-capacitance read scheme in the 2T2C type ferroelectric memory of the prior art.
Figure 2:
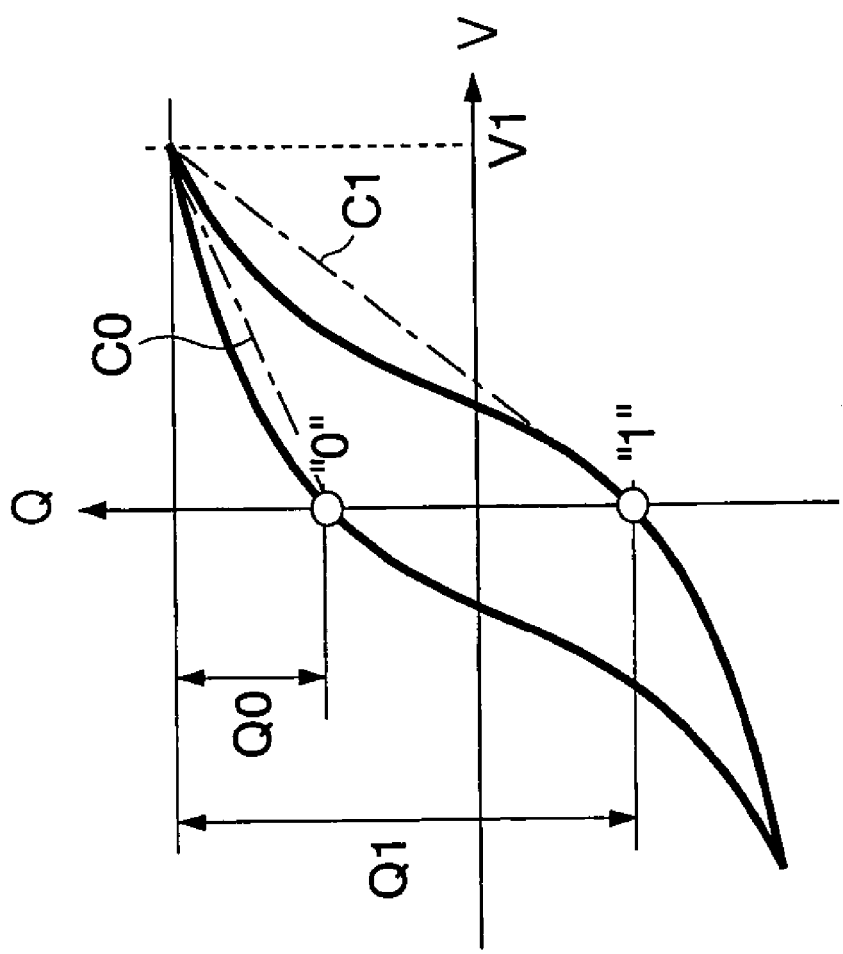
FIG. 2 is a characteristic diagram showing hysteresis loop of a ferroelectric capacitor shown in FIG. 1.
Figure 3:
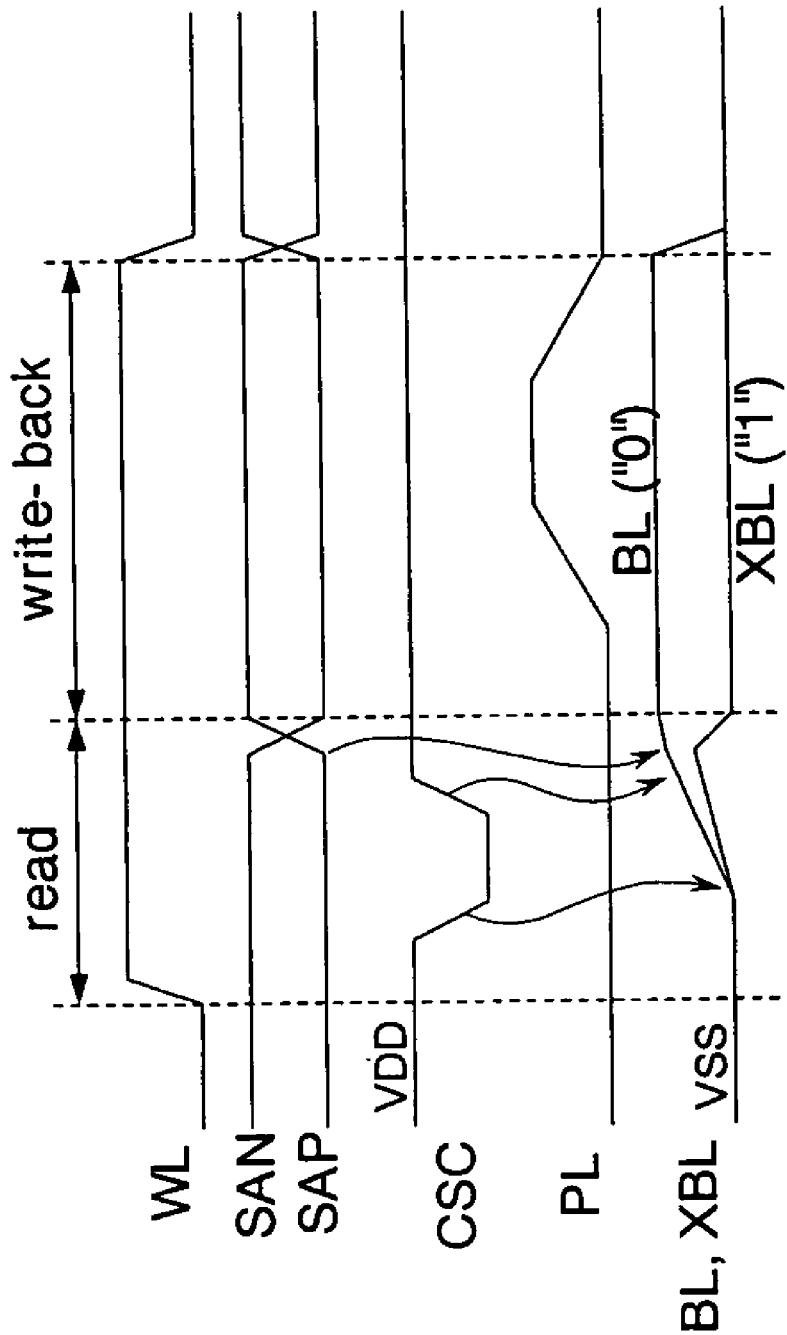
FIG. 3 is a timing chart showing a read operation of the 2T2C type ferroelectric memory shown in FIG. 1.
Figure 4:
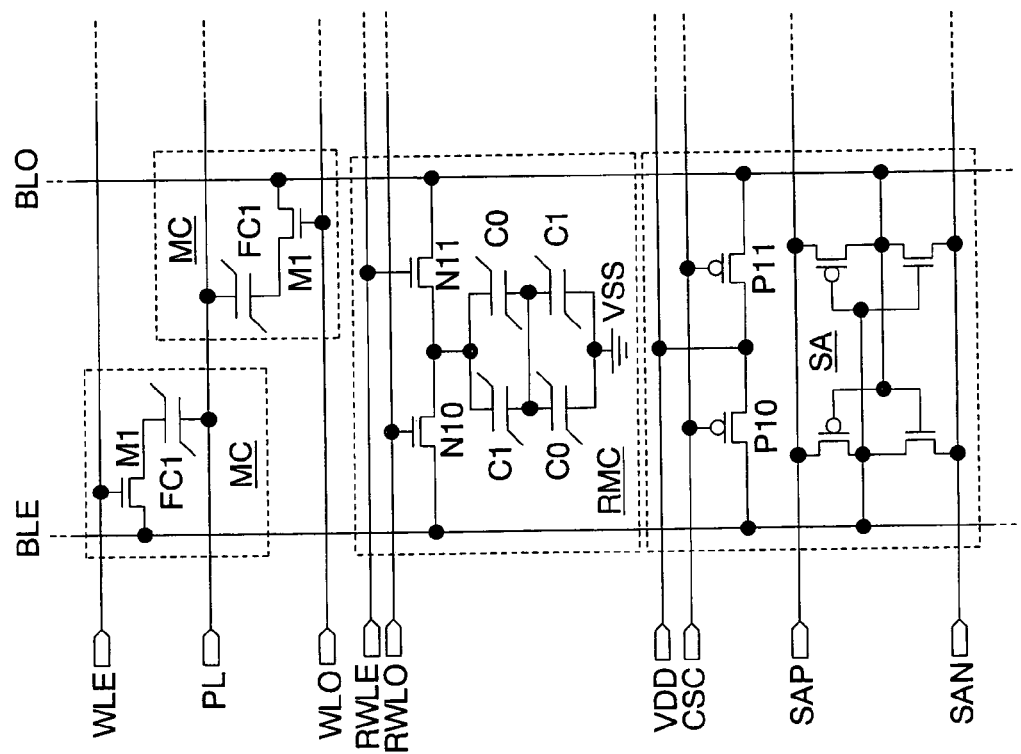
FIG. 4 is a circuit diagram showing a summary of a read circuit of a differential-capacitance read scheme in the 1T1C type ferroelectric memory of the prior art.

The embodiments of the invention will be described with reference to the accompanying drawings. Double circles in the drawings designate external terminals. Signal lines, which are indicated by bold lines in the drawings, are composed of a plurality of lines. Some of the blocks, which are connected with the bold lines, are composed of a plurality of circuits.

Figure 5:
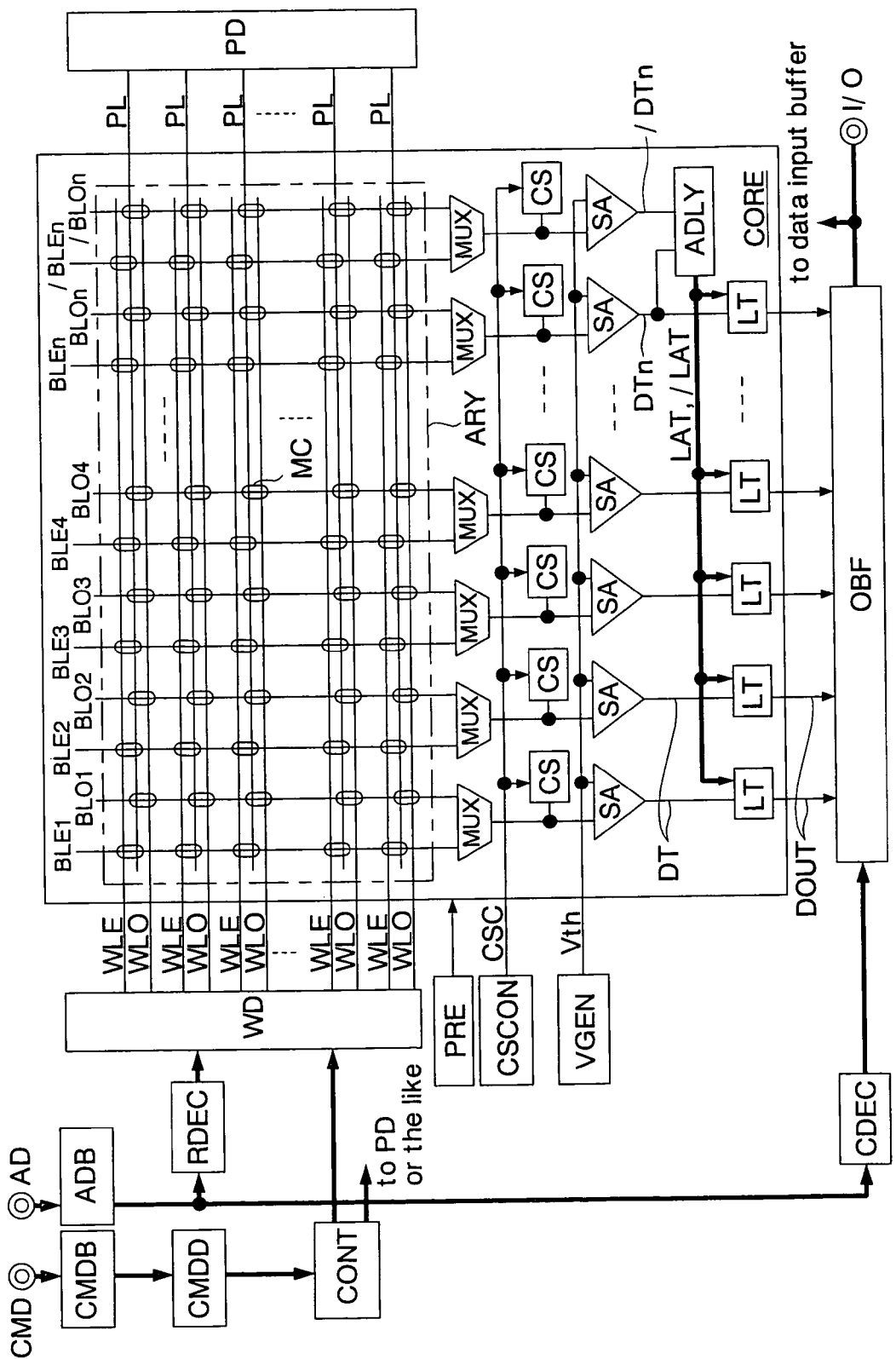
FIG. 5 is a block diagram showing an embodiment of the ferroelectric memory of the invention.

FIG. 5 shows an embodiment of the ferroelectric memory of the invention.

A ferroelectric memory chip is formed on a silicon substrate by using a CMOS process. This ferroelectric memory is used as a work memory of a hand-held terminal of a mobile phone, for example. The ferroelectric memory includes a command buffer CMDB, a command decoder CMDD, a control circuit CONT, an address buffer ADB, a row decoder RDEC, a column decoder CDEC, a word driver WD, a precharge circuit PRE, a current source control circuit CSCON, a threshold voltage generator VGEN, a memory core CORE, a plate driver PD and a data output buffer OBF. FIG. 5 shows the circuits necessary mainly for the read operation. Therefore, the circuits such as a data input buffer and the write amplifier are omitted from FIG. 5.

The command buffer CMDB receives a command signal CMD such as a chip select signal /CS, an output enable signal /OE and a write enable signal /WE through a command terminal, and outputs the received signal to the command decoder CMDD. This command decoder CMDD decodes the operation mode indicated by the command signal, and outputs an operation control signal (such as a read control signal and a write control signal) to the control circuit CONT in accordance with the operation mode decoded.

In response to the operation control signal, the control circuit CONT generates a timing signal for operating the plate driver PD, the word driver WD, the data output buffer OBF and so on.

The address buffer ADB receives an address signal AD through an address terminal and outputs the received signal to the row decoder RDEC and the column decoder CDEC.

The row decoder RDEC decodes high-order bits (a row address) of the address signal to generate a row decode signal, and outputs the generated signal to the word driver WD. The column decoder CDEC decodes low-order bits (a column address) of the address signal to generate a column decode signal, and outputs the generated signal to a column decoder row CDEC.

The word driver WD selects a predetermined word line WL (WLE or WLO) in response to the timing signal from the control circuit CONT and the row decode signal from the row decoder RDEC. The word line WL selected changes from a low level to a high level.

The plate driver PD selects a predetermined plate line PL in response to the timing signal from the control circuit CONT and the row decode signal from the row decoder RDEC. The plate line PL selected changes from a low level to a high level for a predetermined period.

Before the read operation, the precharge circuit PRE precharges a bit line BLE or BLO to a ground voltage VSS. In the read operation, therefore, the voltage of the bit line BLE or BLO precisely changes according to data stored in a memory cell MC.

In response to the timing signal outputted from the control circuit CONT at the read operation, the current source control circuit CSCON outputs a control signal CSC for turning ON a current source CS of the memory core CORE.

The threshold voltage generator VGEN generates a threshold voltage Vth to be used for the read operation. This threshold voltage Vth is a constant voltage (e.g., 2.5 V) independent of a power supply voltage VDD. This power supply voltage VDD is exemplified by a standard value of 3.0 V and is allowed to range from 2.7 V to 3.3 V by the product specification.

In response to the column decode signal, the data output buffer OBF selects 8 bits from the read data of a plurality of bits read from the memory core CORE, and outputs the selected read data to a data input/output terminal I/O. This data input/output terminal I/O is composed of 8 bits.

The memory core CORE includes: a memory cell array ARY; pluralities of multiplexers MUX, current sources CS (or current feed circuits), sense amplifiers SA and latch circuits LT individually corresponding to the bit line pairs composed of the bit lines BLE and BLO; and an adaptive reference generator ADLY. The sense amplifiers SA, the latch circuits LT and the adaptive reference generator ADLY operate as a read control circuit.

The memory cell array ARY includes: a plurality of memory cells MC arranged in a matrix shape; and a plurality of word lines WL (WLE and WLO) and a plurality of bit lines BLE and BLO, which are connected with the memory cells MC. The memory cell MC is a 1T1C type memory cell, as will be shown in FIG. 9, and includes a ferroelectric capacitor FC and a transfer transistor TR. The ferroelectric capacitor FC has its one end connected with the bit line BLE (or BLO) through the transfer transistor TR and its other end connected with the plate line PL. The gate of the transfer transistor TR is connected with the word line WLE (or WLO).

The tails "E" and "O" of the word line WLE or WLO and the bit line BLE or BLO designate an even number and an odd number, respectively. The even word line WLE is connected with the even bit line BLE through the memory cell MC. The odd word line WLO is connected with the odd bit line BLO through the memory cell MC. When one word line WL is selected, therefore, one bit line (BLE or BLO) of a pair and the memory cell MC are connected at all times.

The memory cells MC to be connected with n sets of bit lines BLE1 to BLEn and BLO1 to BLOn operate as normal memory cells for storing the write data inputted from the data input/output I/O. Of these normal memory cells, the memory cells MC to be connected with the bit lines BLEn and BLOn are also called the "first memory cells". The memory cells to be connected with the bit lines /BLEn and /BLOn are second memory cells for storing the inverted data of data (or first data) to be stored in the first memory cells.

In the invention, all the memory cells MC that are connected with the word lines WLE (or WLO) to be selected are simultaneously accessed to in the read operation and the write operation. In other words, there is no reference memory cell that is shared between the different word lines WLE and WLO. At the step of mounting a ferroelectric memory, therefore, the temporary fluctuations of the residual dielectric polarization value due to a heat treatment at the time when the ferroelectric memory chip is soldered on a circuit board exert influences on all the memory cells MC to be simultaneously accessed to. Thus, the reduction in the read margin by the heat treatment is prevented.

In response to the row decode signal, the multiplexer MUX connects either the bit line BLE or BLO with the sense amplifier SA.

For a predetermined period from the start of the read operation, the current source CS feeds a bias current to either the bit line BLE or BLO which is selected by the multiplexer MUX.

The sense amplifier SA differentially amplifies the difference between the voltage of either the bit line BLE or BLO selected by the multiplexer MUX and the threshold voltage Vth, and outputs the amplified voltage to the latch circuit LT. In synchronism with complementary latch signals LAT and /LAT, the latch circuit LT latches the read data outputted from the sense amplifier SA, and outputs the latched data to the data output buffer OBF.

The adaptive reference generator ADLY adjusts the generation timing of the latch signals LAT and /LAT to the optimum in accordance with the data read from the first memory cell connected with the bit line BLEn (or BLOn) and the data read from the second memory cell connected with the bit line /BLEn (or /BLOn). By the adaptive reference generator ADLY, both the read margins of the "logic 0" and the "logic 1" are maximized, as will be described hereinafter.

Figure 6:
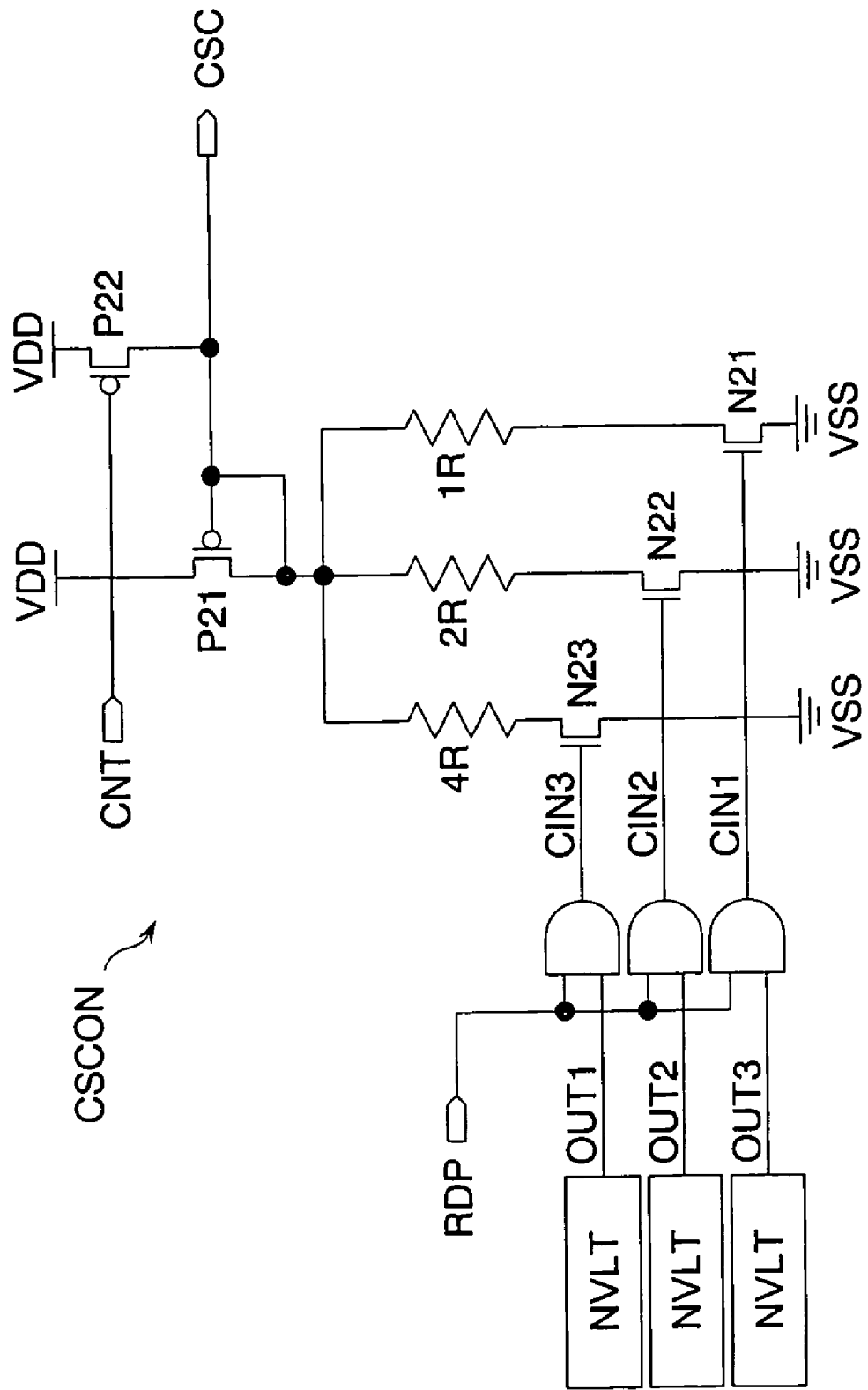
FIG. 6 is a block diagram showing the details of a current source control circuit CSCON.

FIG. 6 shows the details of the current source control circuit CSCON shown in FIG. 5.

The current source control circuit CSCON includes: pMOS transistors P21 and P22; resistors 1R, 2R and 4R; nMOS transistors N21, N22 and N23; and nonvolatile latches NVLT and AND gates individually corresponding to the resistors 1R, 2R and 4R. The head numerals of the resistors 1R, 2R and 4R indicate the resistance ratios of those resistors. Specifically, the resistances of the resistors 1R, 2R and 4R are so sequentially set as are twice as high as the foregoing resistors.

The pMOS transistor P21 constitutes a current mirror circuit together with a pMOS transistor P31 constituting the later-described current source CS shown in FIG. 9. The pMOS transistor P22 is OFF while a control signal CNT is at a high level but ON while the control signal CNT is at a low level. The voltage of the control signal CSC is set to the power supply voltage VDD when the control signal CNT at the low level and when a read control signal RDP is at a low level so that all the nMOS transistors N21, N22, and N23 are OFF. The control signal CNT and the read control signal RDP are outputted from the control circuit CONT and are changed to the high levels for a predetermined period during the read operation.

The resistor 1R (2R or 4R) and the nMOS transistor N21 (N22 or N23) are connected in series between the output node of the control signal CSC and the ground line VSS. The gates of the nMOS transistors N21, N22 and N23 are connected with the outputs CIN1, CIN2 and CIN3 of the AND gates which receive the outputs of the nonvolatile latches NVLT and the read control signal RDP, respectively. The nonvolatile latches NVLT individually output a high level or a low level at all times in accordance with the logic values latched. However, the nonvolatile latches NVLT are inhibited to out the low level altogether.

In this current source control circuit CSCON, the current to be fed to the current mirror circuit is set according to the number of the nMOS transistors N21, N22 and N23 which are turned ON for the predetermined period in the read operation. In case the control signals CIN1 and CIN2 are at the high level whereas the control signal CIN3 is at the low level, for example, the nMOS transistors N21 and N22 are turned ON, but the nMOS transistor N23 is turned OFF. As a result, a current corresponding to (VDD−VT)/(R+2R) flows through the current mirror circuit. Here, letters VT designate the threshold voltage (of an absolute value) of the pMOS transistor P21.

In response to the control signals CIN1, CIN2 and CIN3 of three bits outputted from the nonvolatile latches NVLT, the voltage of the control signal CSC is set to one of seven low-level voltages. As a result, the current flow through the current mirror circuit can be easily adjusted according to the data latched by the nonvolatile latches NVLT.

The values to be stored in the nonvolatile latches NVLT can be set after the ferroelectric memory was fabricated. In other words, the current value through the current mirror circuit can be set after the fabrication of the ferroelectric memory. As a result, the device characteristics can be altered according to the product specifications of the ferroelectric memory. Specifically, the ferroelectric memory having a high-speed access is fabricated by setting the current value high. If the current value is set low, the ferroelectric memory has a large rewrite number and a high reliability. One chip can be fabricated into a plurality of products of different specifications according to the values to be stored in the nonvolatile latches NVLT, so that the production cost can be reduced.

Figure 7:
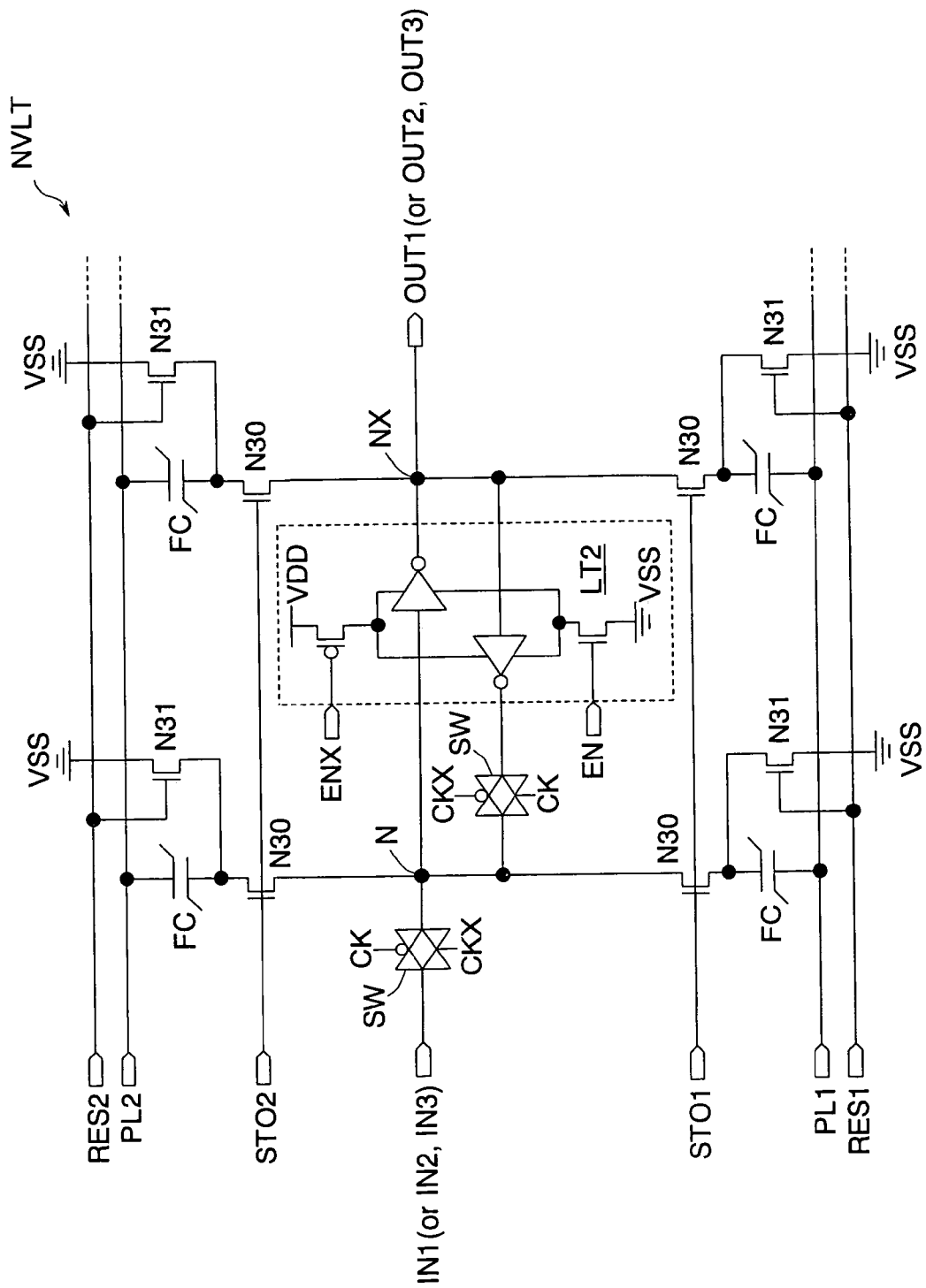
FIG. 7 is a circuit diagram showing one example of a nonvolatile latch NVLT shown in FIG. 6.

FIG. 7 shows one example of the nonvolatile latch NVLT shown in FIG. 6.

The nonvolatile latch NVLT includes: a latch circuit LT2 having a switch for blocking the power supply voltage VDD and the ground voltage VSS; two CMOS switches SW for writing data in the latch circuit LT2; a pair of ferroelectric capacitors FC connected in series between plate lines PL1 and PL2 through an input node N of the latch circuit LT2; a pair of ferroelectric capacitors FC connected in series between the plate lines PL1 and PL2 through an output node NX of the latch circuit LT2; a plurality of nMOS transistors N30 for connecting the ferroelectric capacitors FC individually with the nodes N and NX; and nMOS transistors N31 for preventing one end of the ferroelectric capacitor FC from floating.

The nMOS transistors N30 are individually controlled with store signals STO1 and STO2. The nMOS transistors N31 are individually controlled with reset signals RES1 and RES2. The CMOS switches SW are individually connected with complementary clock signals CK and CKX.

The nonvolatile latch circuit NVLT is omitted on its detailed description because it is a well-known circuit. Here, the latch circuit to be applied to the invention should not be limited to the nonvolatile latch circuit NVLT. For example, the nonvolatile latch circuit may be constituted of a nonvolatile flip-flop circuit or a nonvolatile SRAM having a ferroelectric capacitor.

The nonvolatile flip-flop circuit is constituted by connecting either two nonvolatile latches NVLT or a nonvolatile latch circuit NVLT and a volatile latch circuit in tandem. Like the nonvolatile latch circuit NVLT, the nonvolatile SRAM has a memory cell composed of six transistors and four ferroelectric capacitors. The latch circuit is constituted by using the ferroelectric capacitors having a structure like that of the ferroelectric capacitors of the memory cell MC, so that the fabrication process can be prevented from being complicated.

Figure 8:
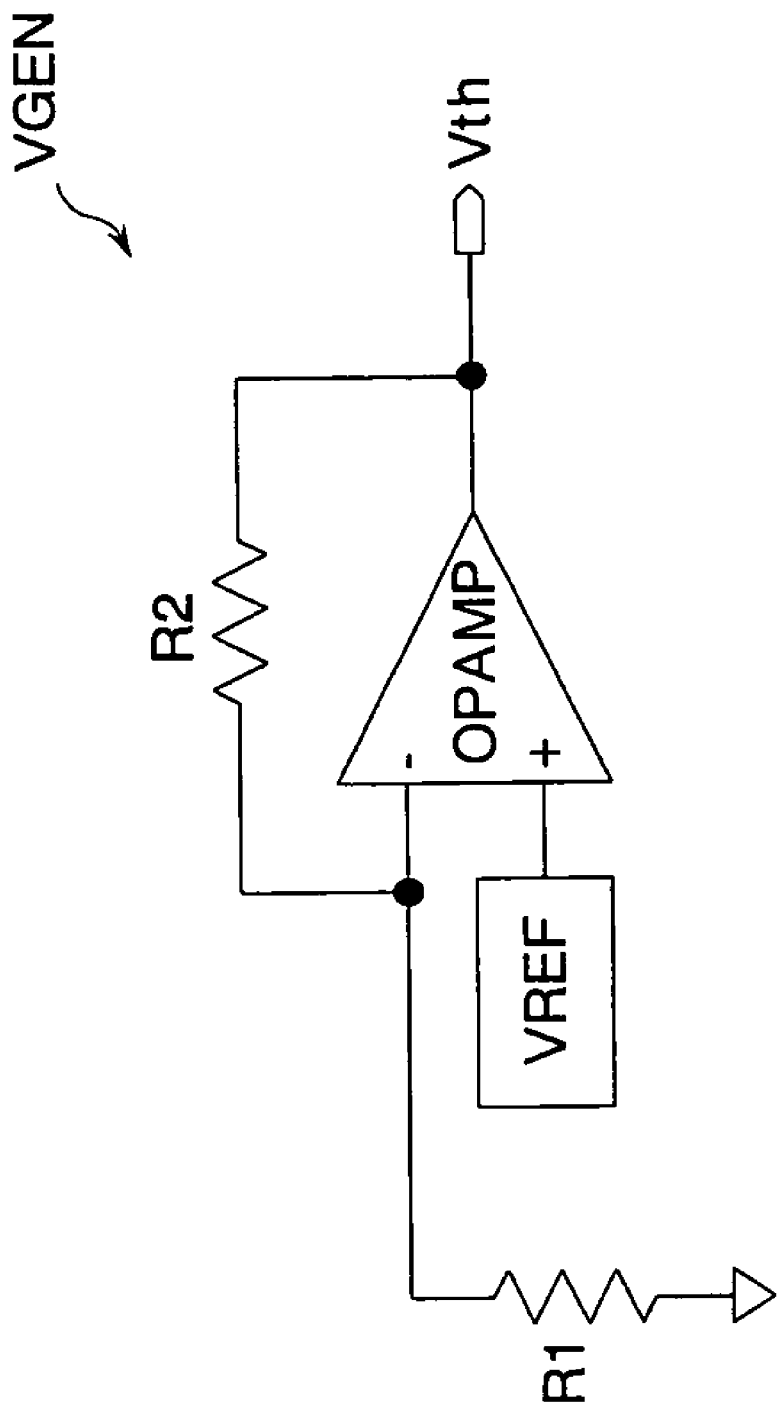
FIG. 8 is a circuit diagram showing the details of a threshold voltage generator VGEN shown in FIG. 5.

FIG. 8 shows the details of the threshold voltage generator VGEN shown in FIG. 5.

This threshold voltage generator VGEN includes: a band gap reference VREF constituted of the well-known CMOS circuit; an operation amplifier OPAMP; and resistors R1 and R2. The band gap reference VREF generates a reference voltage (substantially at 1.2 V) or the voltage of the band gap of silicon. The operation amplifier OPAMP makes such a feedback control that the voltage divided from the threshold voltage Vth by the resistors R1 and R2 and the reference voltage may be equal, thereby to generate a constant threshold voltage Vth (of 2.5 V). The reference voltage is always kept at a constant value independently of the changes in the operating temperature of the ferroelectric memory, the power supply voltage, and the process conditions in the fabrication process of the ferroelectric memory. As a result, the threshold voltage generator VGEN can generate the threshold voltage Vth of a constant value at all times.

Figure 9:
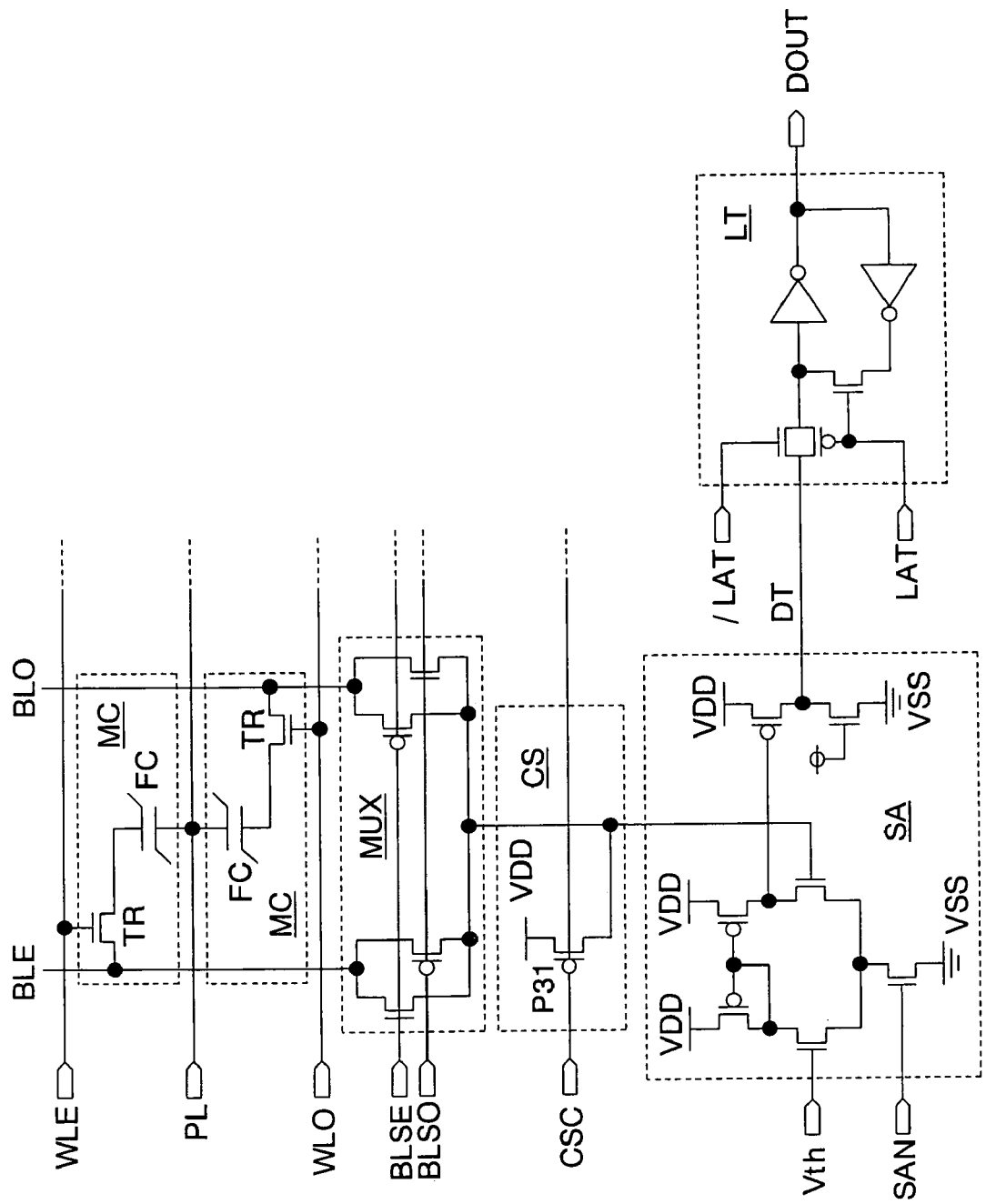
FIG. 9 is a circuit diagram showing the details of an essential portion of a memory core CORE shown in FIG. 5.

FIG. 9 shows the details of an essential portion of the memory core CORE shown in FIG. 5.

The memory cell MC is a 1T1C memory cell having the ferroelectric capacitor FC and the transfer transistor TR. The ferroelectric capacitor FC has its one end connected with the bit line BLE (or BLO) through the transfer transistor TR and its other end connected with the plate line PL. The gate of the transfer transistor TR is connected with the word line WLE (or WLO).

The multiplexer MUX has the nMOS transistor and the pMOS transistor on each bit line BLE or BLO. The nMOS transistor and the pMOS transistor are individually controlled with bit line selection signals BLSE and BLSO or a kind of row decode signals. The bit line selection signal BLSE changes to a high level when the even word line WLE is selected. The bit line selection signal BLSO changes to a high level when the odd word line WLO is selected.

The current source CS has the pMOS transistor P31 for receiving at its gate the control signal CSC outputted from the current source control circuit CSCON. The current source CS feeds the bit line BLE (or BLO) with the current according to the low-level voltage while the control signal CSC is at the low level.

The sense amplifier SA is constituted by combining a differential amplification type amplifier and a common source type amplifier. In response to a sense amplifier activation signal SAN, the differential amplification type amplifier is activated to amplify the voltage difference between the threshold voltage Vth and the bit line BLE (or BLO) differentially. Before the start of the read operation, the bit lines BLE and BLO are precharged to the ground voltage VSS. On the other hand, the threshold voltage Vth to be fed to the sense amplifier SA is generated at all times. Therefore, the voltages of the bit lines BLE and BLO before the read start are lower than the threshold voltage Vth. Therefore, the sense amplifier SA does not malfunction even if it is activated at an early time of the read operation. As a result, the activation timing of the sense amplifier SA can be early set to shorten the read access time.

The common source type amplifier transforms the output voltage of the differential amplification amplifier into the CMOS level, and outputs the transformed voltage as a data signal DT (or read data). In the read operation, the sense amplifier SA changes the data signal DT from the low level to the high level when the voltage of the bit line BLE (or BLO) exceeds the threshold voltage Vth.

The latch circuit LT includes: a latch composed of a pair of CMOS inverters; a CMOS switch for transmitting the data signal DT to the latch; and an nMOS transistor for blocking the feedback loop of the latch. The CMOS switch is turned ON when the latch signal LAT (or /LAT) is at the low level (or at the high level) and OFF when the latch signal LAT (or /LAT) is at the high level (or at the low level). The nMOS transistor renders the loop conductive when the latch signal LAT is at the high level, and blocks the loop when the latch signal LAT is at the low level. The latch circuit LT outputs its latched data as a data signal DOUT. Here, the nMOS transistor may be replaced by the CMOS switch.

Here, the sense amplifiers SA corresponding to bit lines BLEn and /BLEn individually output data signals DTn and /DTn, as shown in FIG. 5. The data signal DTn is outputted not only to the latch circuit LT but also to the adaptive reference generator ADLY. The data signal /DTn is outputted only to the adaptive reference generator ADLY.

Figure 10:
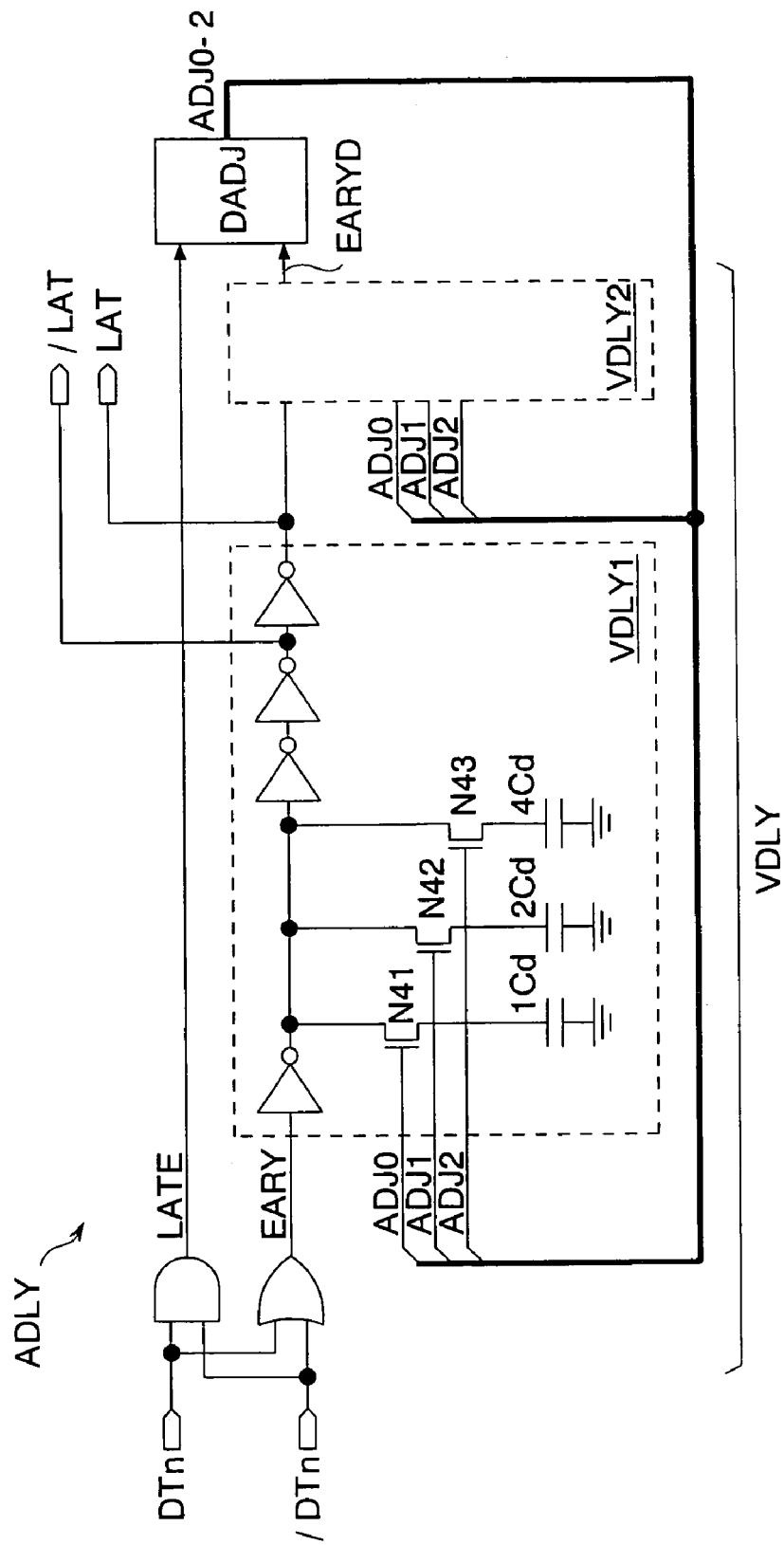
FIG. 10 is a block diagram showing the details of an adaptive reference generator ADLY shown in FIG. 5.

FIG. 10 shows the details of the adaptive reference generator ADLY shown in FIG. 5.

The adaptive reference generator ADLY includes a variable delay circuit VDLY and a delay adjustment circuit DADJ. The variable delay circuit VDLY has a pair of variable delay stages VDLY1 and VDLY2 connected in series, an AND gate and an OR gate.

In synchronism with that of the data signals DTn and /DTn which later changes to the high level, the AND gate outputs a late arrival signal LATE to change to the high level. Specifically, the AND gate operates as a late arrival decision circuit for selecting that of the data signals DTn and /DTn which is later transmitted, and for outputting the selected signal to the delay adjustment circuit DADJ. The data signal to be later transmitted can be easily read by the AND gate.

In synchronism with that of the data signals DTn and /DTn which early changes to the high level, the OR gate outputs an early arrival signal EARYD to change to the high level. Specifically, the OR gate operates as an early arrival decision circuit for selecting that of the data signals DTn and /DTn which is earlier transmitted, and for outputting the selected signal to a variable delay stage VDLY1. The data signal to be early transmitted can be easily read by the OR gate.

When the ferroelectric capacitor FC of the memory cell MC (or the first memory cell) to be connected with the bit line BLEn is stored with the "logic 0", as has been described with reference to FIG. 5, the ferroelectric capacitor FC of the memory cell MC (or the second memory cell) to be connected with the bit line /BLEn is stored with the "logic 1". These storages also occur on the bit line BLOn or /BLOn. The effective capacitance C0 of the ferroelectric capacitor FC for storing the "logic 0" is smaller than the effective capacitance C1 of the ferroelectric capacitor FC for storing the "logic 1". When the same current is fed in the read operation from the current source CS to the bit-line BLEn or /BLEn, therefore, the voltage of the bit line (e.g., BLEn) corresponding to the "logic 0" rises earlier than the voltage of the bit line (e.g., /BLEn) corresponding to the "logic 1".

The sense amplifiers SA change their outputs individually to the high level when the voltages of the bit line BLEn or /BLEn exceed the threshold voltage Vth. Therefore, the rising edge of the early arrival signal EARYD outputted from the OR gate is timed to the instant when the sense amplifier SA detects the "logic 0". The rising edge of the late arrival signal LATE outputted from the AND gate is timed to the instant when the sense amplifier SA detects the "logic 1". In short, the rising edge timings of the early arrival signal EARYD and the late arrival signal LATE mean the reads of the "logic 0" and the logic "1", respectively. Thus, in the invention, the logic of the read data to be read to the bit line BLE or BLO is read not as the voltage difference but as the time difference.

The variable delay stage VDLY1 at a first stage delays the early arrival signal EARYD outputted from the OR gate, by a predetermined time T1, and outputs the delayed signal as the latch signal /LAT or LAT. The variable delay stage VDLY2 at a post stage delays the latch signal LAT by the predetermined time T1, and outputs the delayed signal as a delayed latch signal EARYDD to the delay adjustment circuit DADJ. The first and post variable delay stages VDLY1 and VDLY2 are always set to the same delay time T1 in response to the same delay adjustment signals ADJ0-2.

Each of the variable delay stages VDLY1 and VDLY2 includes three capacitors 1Cd, 2Cd and 4Cd, which are connected with the transmission path of the early arrival signal EARYDD (i.e., the transmission path of the latch signal LAT) through transistors N41, N42 and N43. The head numerals of the capacitors 1Cd, 2Cd and 4Cd indicate those capacitance ratios. Specifically, the capacitances of the capacitors 1Cd, 2Cd and 4Cd are so sequentially set as are twice as high as the foregoing capacitors. The gates of the nMOS transistors N41, N42 and N43 individually receive the delay adjustment signals ADJ0-2 outputted from the delay adjustment circuit DADJ. The capacitances to be added to the transmission path of the early arrival signal EARYDD is set to eight values (0Cd-7Cd) according to the logic values of the delay adjustment signals ADJ0-2 of 3 bits.

At each read operation, the delay adjustment circuit DADJ compares the arrival times of the delayed latch signal EARYDD, which is delayed from the early arrival signal EARYDD by the variable delay stages VDLY1 and VDLY2, and the late arrival signal LATE. In case the arrival of the delayed latch signal EARYDD is earlier than that of the late arrival signal LATE, the delay adjustment circuit DADJ increases the logic values, which are indicated by the delay adjustment signals ADJ0-2, by "1" so as to elongate the delay time of the variable delay circuit VDLY.

Here, the delay adjustment signal ADJ0 corresponds to the low-order bit, and the delay adjustment signal ADJ2 corresponds to the high-order bit. In case the arrival of the delayed latch signal EARYDD is earlier than that of the late arrival signal LATE, the delay adjustment circuit DADJ increases the logic values, which are indicated by the delay adjustment signals ADJ0-2, by "1" so as to change the delay adjustment signals ADJ0-2. For example, the delay adjustment signals ADJ0-2 are changed from the "logic 011" of a binary number to the "logic 100", so that the capacitance to be added to the transmission path of the early arrival signal EARYDD increases from "3Cd" to "4Cd". Both the delay times of the variable delay stages VDLY1 and VDLY2 increase by the same time.

In case the arrival of the delayed latch signal EARYDD is later than that of the late arrival signal LATE, the delay adjustment circuit DADJ decreases the logic values, which are indicated by the delay adjustment signals ADJ0-2, by "1" so as to change the delay adjustment signals ADJ0-2. For example, the delay adjustment signals ADJ0-2 are changed from the "logic 011" of a binary number to the "logic 010", so that the capacitance to be added to the transmission path of the early arrival signal EARYDD decreases from "3Cd" to "2Cd". Both the delay times of the variable delay stages VDLY1 and VDLY2 decrease by the same time. This adjustment of the delay time T1 is executed at each read operation until the arrival of the delayed latch signal EARYDD and the arrival of the late arrival signal LATE coincide.

When the rising edge timing of the delayed latch signal EARYDD and the rising edge timing of the late arrival signal LATE become identical, the output timing of the latch signals LAT and /LAT is set at the center between the rising edge timing of the early arrival signal EARYDD and the rising edge timing of the late arrival signal LATE. Specifically, the output timing of the latch signals LAT and /LAT is set at the center between the times, at which the sense amplifier SA reads the "logic 0" and the "logic 1". As a result, a first period P1 from the time when the voltage of the bit line for reading the "logic 0" exceeds the threshold voltage Vth to the time when the latch signals LAT and /LAT are outputted, and a second period P2 from the time when the latch signals LAT and /LAT are outputted to the time when the voltage of the bit line for reading the "logic 1" exceeds the threshold voltage Vth, become equal to each other. In other words, the read margins individually become the maximum for the "logic 0" and the "logic 1".

The delay time is adjusted at each read operation. Even in case the latch timing is shifted by either a change in the temperature in the operation of the ferroelectric memory or a change in the power supply voltage VDD, therefore, the latch timing having the largest read margin can be restored. In case the residual dielectric polarization value is varied by a deterioration of the ferroelectric capacitor FC, moreover, the read margin can always be maximized for the "logic 0" and the "logic 1".

Figure 11:
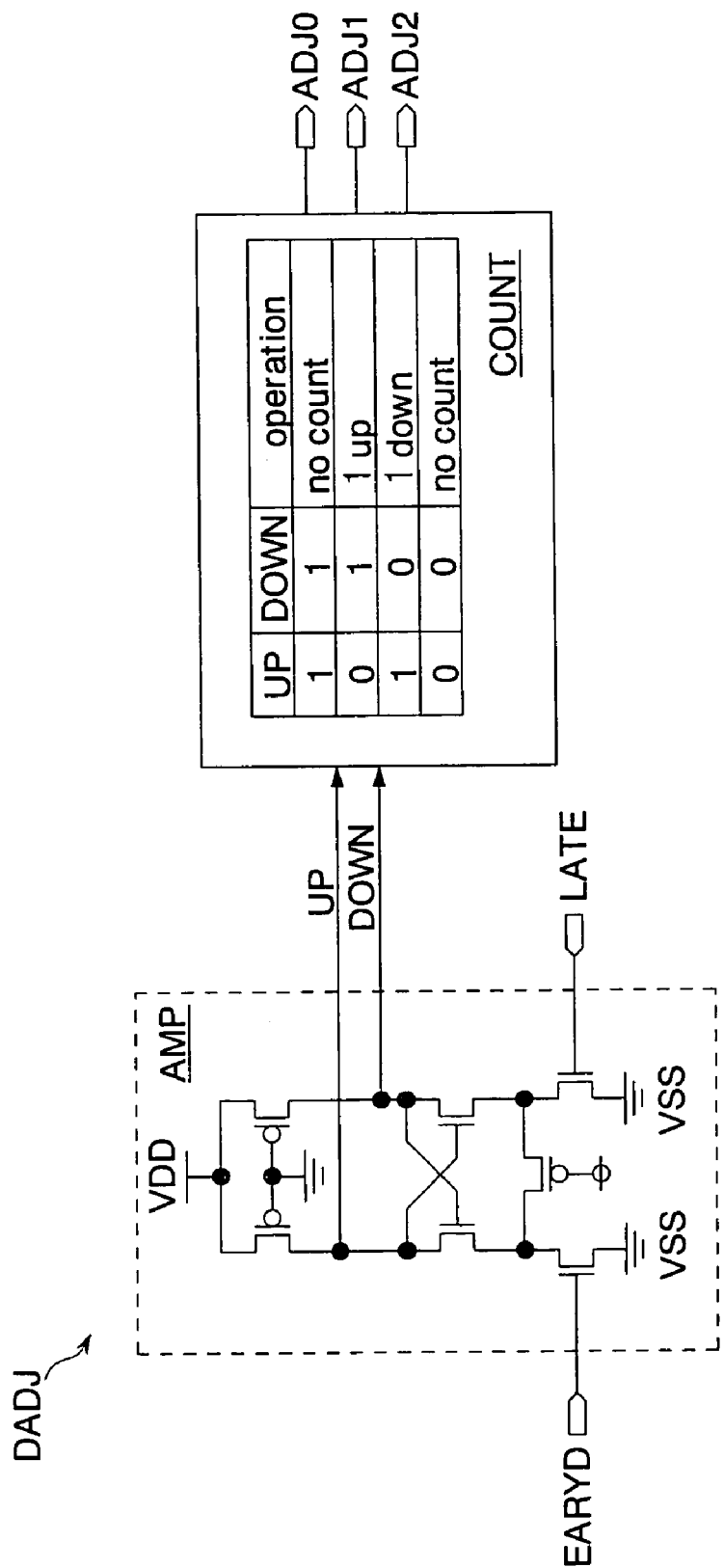
FIG. 11 is a block diagram showing the details of a delay adjustment circuit DADJ shown in FIG. 10.

FIG. 11 shows the details of the delay adjustment circuit DADJ shown in FIG. 10.

The delay adjustment circuit DADJ includes: a differential amplifier AMP for deciding the early arrival of the rising edges of the delayed latch signal EARYDD and the late arrival signal LATE, to output an up signal UP or a down signal DOWN; and a counter COUNT for operating in response to the up signal UP or the down signal DOWN. The differential amplifier AMP changes the up signal UP to the low level, when the rising edge of the delayed latch signal EARYDD is earlier than that of the late arrival signal LATE. The differential amplifier AMP changes the down signal DOWN to the low level, when the rising edge of the delayed latch signal EARYDD is later than that of the late arrival signal LATE. The drains of the nMOS transistors for individually receiving the up signal UP and the down signal DOWN are connected with each other through a keeper transistor for making blunt the read sensitivity of the differential amplifier AMP.

The counter COUNT is an up-down counter of 3 bits for counting up in response to the falling edge of the up signal UP and for counting down in response to the falling edge of the down signal DOWN thereby to output the counted values as the delay adjustment signals ADJ0-2. Specifically, the counter COUNT counts down when the first period P1 is longer than the second period P2, and counts up when the first period P1 is shorter than the second period P2.

When both the up signal UP and the down signal DOWN are at the high level, the read operation is not executed so that the differential amplifier AMP is in an inoperative state. At this time, the counter COUNT does not operate. When both the up signal UP and the down signal DOWN are at the low level, the rising edge timings of the delayed latch signal EARYD and the late arrival signal LATE are identical to each other. Specifically, when the rising difference between the delayed latch signal EARYDD and the late arrival signal LATE is smaller than the quantitation error (i.e., the minimum delay adjusting time) of the variable delay circuit VDLY, both the up signal UP and the down signal DOWN are set to the low level. At this time, too, the counter COUNT does not operate. The read sensitivity of the differential amplifier AMP is made slightly blunter than that of the keeper transistor so that the delay time of the variable delay circuit VDLY is prevented from being varied for each read operation by the slight difference between the rising edges.

Figure 12:
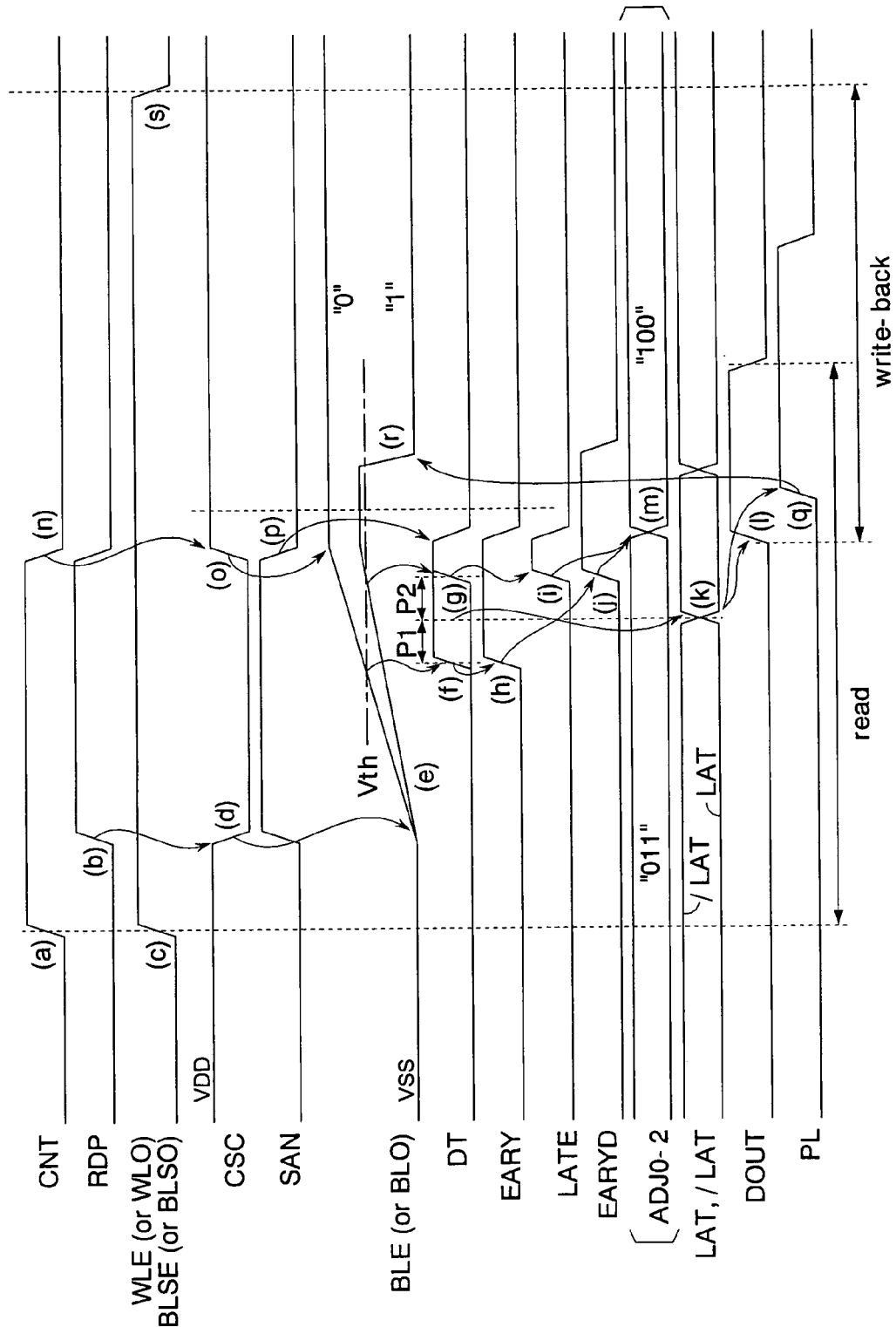
FIG. 12 is a timing chart showing a read operation of the ferroelectric memory of the invention.

FIG. 12 shows the read operations of the ferroelectric memory of the present invention.

The memory cell MC is written in advance with data from the exterior. In the memory cell MC (i.e., the first memory cell) connected with the bit line BLEn or /BLEn, there are written the inverted data, which are stored in the memory cell MC (i.e., the second memory cell) connected with the bit line BLOn or /BLOn.

When the read command and the address signal AD for selecting the memory cell MC for reading the data are fed to the ferroelectric memory, the control circuit CONT shown in FIG. 5 outputs the control signal CNT and the read control signal RDP (at (a) and (b) in FIG. 12). The word driver WD changes the word line WLE (or WLO) corresponding to the address signal AD, to the high level. In response to the address signal AD, the row decoder RDEC changes the bit line selection signal BLSE (or BLSO) to the high level (at (c) in FIG. 12).

The current source control circuit CSCON shown in FIG. 6 changes the control signal CSC to the low level (at (d) in FIG. 12) in synchronism with the rising edge of the read control signal RDP. The low-level voltage of the control signal CSC is set according to the data stored in the nonvolatile latch NVLT. In response to the change in the control signal CSC, the current source CS is turned ON to feed the current to the bit line BLE (or BLO). The voltage of the bit line BLE (or BLO) gradually rises (at (e) in FIG. 12) in accordance with the residual dielectric polarization value (or capacitance) of the ferroelectric capacitor FC connected with the word line WLE (or WLO). As described above, the voltage of the bit line connected with the ferroelectric capacitor FC for storing the "logic 0" rises earlier than the voltage of the bit line connected with the ferroelectric capacitor FC for storing the "logic 1".

The sense amplifier SA shown in FIG. 9 changes the data signal DT to the high level (at (f) in FIG. 12), when the voltage of the bit line connected with the ferroelectric capacitor FC for storing the "logic 0" exceeds the threshold voltage Vth. Likewise, another sense amplifier SA changes the data signal DT to the high level (at (g) in FIG. 12), when the voltage of the bit line connected with the ferroelectric capacitor FC for storing the "logic 1" exceeds the threshold voltage Vth.

The OR gate of the adaptive reference generator ADLY shown in FIG. 10 outputs the early arrival signal EARYDD (at (h) in FIG. 12) in synchronism with the early arrival data signal DT (DTn or /DTn). The AND gate outputs the late arrival signal LATE (at (i) in FIG. 12) in synchronism with the late arrival data signal DT (DTn or /DTn). Moreover, the adaptive reference generator ADLY delays the early arrival signal EARYDD with the two variable delay stages VDLY1 and VDLY2, and outputs the delayed signal as a delayed latch signal EARYDD (at (j) in FIG. 12).

FIG. 12 shows an example, in which the delay time of the variable delay circuit VDLY is set to the optimum. Therefore, the rising edge of the delayed latch signal EARYDD is timed to that of the late arrival signal LATE. Moreover, the period P1 from the rising edge of the early arrival data signal DT to the output of the latch signal LAT or /LAT is equal to the period P2 from the output of the latch signal LAT or /LAT to the rising edge of the late arrival data signal DT. Still moreover, these periods P1 and P2 are equal to the delay time T1 of the variable delay stages VDLY1 and VDLY2.

The variable delay stage VDLY1 outputs the latch signal LAT or /LAT (at (k) in FIG. 12). The output timing of the latch signal LAT or /LAT maximizes the read margin for the "logic 0" and the "logic 1". The latch circuit LT shown in FIG. 9 outputs the read data, which are latched in synchronism with the latch signal LAT or /LAT, as the data signal DOUT (at (l) in FIG. 12).

In case the period P1 is shorter than the period P2, on the other hand, the delay adjustment circuit DADJ increases the logic values of the adjustment signals ADJ0-2 from "011" to "100", thereby to increase the delay time of the variable delay circuit VDLY (at (m) in FIG. 12). At this time, the output timing of the latch signal LAT or /LAT is slightly delayed in the following read operation.

After the sense amplifier SA outputted the data signal DT, the control circuit CONT changes the control signal CNT to the low level (at (n) in FIG. 12). In response to this low-level control signal CNT, the control signal CSC changes to the high level (at (o) in FIG. 12). Moreover, the sense amplifier activation signal SAN changes to the low level so that the sense amplifier SA is inactivated (at (p) in FIG. 12).

After the read data were fixed, the plate driver PD shown in FIG. 5 changes the plate line responding to the address signal AD, to the high level for a predetermined period (at (q) in FIG. 12). The voltage of the bit line BLE (or BLO) changes according to the residual dielectric polarization value of the ferroelectric capacitor FC (at (r) in FIG. 12). The bit line connected with the ferroelectric capacitor FC stored with the "logic 1" changes to the low level, and the bit line connected with the ferroelectric capacitor FC stored with the "logic 0" changes to the high level. Then, the data read from the memory cell MC is written back again to the memory cell MC. After this write-back was completed, the word line WLE (or WLO) changes to the low level, and the read operation is completed (at (s) in FIG. 12).

The rising timing of the plate line PL is set after a predetermined time of the rising edge of the latch signal LAT, for example. The latch signal LAT is generated from the data signal DT by the adaptive reference generator ADLY. Therefore, the plate line PL can always be raised independently of the operation environment at an optimum time from the output of the data signal DT. As a result, during the output of the read data DOUT, the write-back can be started to shorten the read cycle time. In the prior art, on the contrary, the delay circuit sets the rising timing of the plate line or the like formed in the control circuit CONT. Considering the worst operating voltage and temperature, therefore, it is necessary to set the rising timing of the plate line PL, so that the write-back has been unable to be started during the output of the read data DOUT.

In the embodiment thus far described, the logic value of the data stored in the memory cell MC is detected as the time difference. The circuit for detecting the time can be formed more easily and made more precise than the circuit for reading the voltage. As a result, the simple circuit can reliably read the data.

The time difference can be reliably generated even if the bit line has a small voltage change. In case the residual dielectric polarization value of the ferroelectric capacitor FC is small, therefore, the data can be reliably read from the memory cell MC. Even in case the ferroelectric capacitor FC is deteriorated, therefore, the read margin of the data can be retained. Even if the ferroelectric capacitor FC is deteriorated, the data can be read to increase the data rewritable number.

The output timing of the latch signal LAT or /LAT is set at the center between the timing, at which the "logic 0" is outputted, and the timing, at which the "logic 1" is outputted. The timing for deciding the logic value, of the data is set at the center between the read timings of the two logic values, so that the read margin of the data can be maximized for each of the two logic values.

The output timing of the latch signal LAT or /LAT is adjusted for each read operation in response to the output timing of the data so that the read margin can always be maximized. The delay adjustment is executed at each read operation, so that the output timing of the latch signal LAT or /LAT can always be set optimum even in case the temperature or the power supply voltage VDD fluctuates during the operation of the ferroelectric memory.

The capacitances of the capacitors 1Cd, 2Cd and 4Cd composing the variable delay stages VDLY1 and VDLY2 are set to increase twice by twice so that the capacitors 1Cd, 2Cd and 4Cd to be connected with the transmission path of the early arrival signal EARYDD are set according to the counter values of the binary counters. As a result, the delay time can be equidistantly adjusted according to the weighing of the binary counter.

In accordance with the timing difference between the transition edge of the delayed latch signal EARYDD delayed from the early arrival signal EARYDD by the variable delay state VDLY1 or VDLY2 and the transition edge of the late arrival signal LATE, the delay time T1 of the variable delay stage VDLY1 or VDLY2 is adjusted to output the latch signal LAT or /LAT from the connection node of the two variable delay stages VDLY1 and VDLY2 always having the same delay time T1. Therefore, the time difference between the first period P1 and the second period P2 can be easily and reliably eliminated to set the transition edge of the latch signals LAT and /LAT at the center between the transition edge of the early arrival signal EARYDD and the transition edge of the late arrival signal LATE.

The write-back operation is started in response to the output of the latch signal LAT so that it can be executed over the data reading operation. As a result, the read cycle time can be shortened.

The OR gate is formed as the early arrival decision circuit so that the data signal to be earlier transmitted can be easily read. On the other hand, the AND gate is formed as the late arrival decision circuit so that the data signal to be later transmitted can be easily read.

The precharge circuit for precharging the bit line BLE or BLO before the read operation is formed so that the voltage of the bit line BLE or BLO can be raised while precisely reflecting the effective capacitance of the ferroelectric capacitor FC.

The threshold voltage generator VGEN is formed in the ferroelectric memory so that the desired threshold voltage Vth can be easily generated without any fluctuation.

Here, the aforementioned embodiment has been described on the example, in which the invention is applied to the ferroelectric memory chip. For example, the invention may also be applied to a ferroelectric memory core, which is mounted in a mixed manner on a system LSI.

The variable delay circuit VDLY may use a differential amplification type delay circuit to delay the complementary signals. In this case, the output timings of the latch signals LAT and /LAT can be made identical to operate the latch circuit LT at a high speed.

The invention is not limited to the above embodiments and various modifications may be made without departing from the spirit and scope of the invention. Any improvement may be made in part or all of the components.

What is claimed is:

1. A ferroelectric memory comprising:
   a plurality of normal memory cells each including a ferroelectric capacitor which stores data fed from an exterior;
   a second memory cell including a ferroelectric capacitor which stores inverted data of first data stored in a first memory cell of said normal memory cells;
   bit lines individually connected with said normal memory cells and said second memory cell;
   current feed circuits which feed electric currents to said bit lines for a predetermined period from a start of a read operation; and
   a read control circuit which decides logic values of data read from said normal memory cells to said bit lines, in the read operation in a predetermined time after a voltage of any of said bit lines connected with said first and second memory cells first exceeds a threshold voltage, wherein
   said predetermined time is set to be a time from when a voltage of one of said bit lines connected with said first and second memory cells exceeds a threshold voltage to when a voltage of the other one of said bit lines connected with said first and second memory cells exceeds the threshold voltage.

2. The ferroelectric memory according to claim 1, wherein said read control circuit includes a variable delay circuit which sets said predetermined time to one half of a period from a time when a voltage of one part of said bit lines connected with said first and second memory cells exceeds said threshold voltage to a time when a voltage of the other part of said bit lines connected with said first and second memory cells exceeds said threshold voltage.

3. The ferroelectric memory according to claim 2, wherein said read control circuit includes:
   a plurality of differential amplification type sense amplifiers which individually receive the voltages of said individual bit lines and said threshold voltage; and
   a plurality of latch circuits which individually latch read data amplified by said sense amplifiers, in synchronism with latch signals, and wherein
   said variable delay circuit outputs said latch signals after said predetermined time.

4. The ferroelectric memory according to claim 3, wherein said read control circuit includes a delay adjustment circuit which detects a difference between a first period from the time when the voltage of one part of said bit lines connected with said first and second memory cells exceeds the threshold voltage to the time when said latch signals are outputted, and a second period from a time when said latch signals are outputted to a time when the voltage of the other part of said bit lines connected with said first and second memory cells exceeds said threshold voltage, thereby to output an adjustment signal which reduces said difference to said variable delay circuit.

5. The ferroelectric memory according to claim 4, wherein said delay adjustment circuit includes a counter which reverses a count direction in a case where said first period is longer than said second period, compared to a case where said first period is shorter than said second period, and outputs its counter value as said adjustment signal.

6. The ferroelectric memory according to claim 5, wherein said variable delay circuit includes:
   a plurality of load capacitors connected with a generation path of said latch signals; and
   a switch which connects or disconnects the load capacitors with or from said generation path in accordance with said counter value.

7. The ferroelectric memory according to claim 6, wherein capacitances of said load capacitors are set to increase twice by twice.

8. The ferroelectric memory according to claim 3, wherein a write-back operation to write data read from said memory cells back again in said memory cells starts in response to said latch signal.

9. The ferroelectric memory according to claim 8, further comprising plate lines individually connected with said ferroelectric capacitors, wherein:
   said write-back operation is executed by driving said plate lines, and said plate lines starts to be driven in response to said latch signals.

10. The ferroelectric memory according to claim 4, wherein said variable delay circuit includes two variable delay stages which have delay times set always equal to each other and which are connected in series with each other, said variable delay stage at the first stage outputs said latch signal in said predetermined time after the voltage of said one part of said bit lines exceeds said threshold voltage, said variable delay stage at the second stage outputs a delayed latch signal delayed from said latch signal, and said delay adjustment circuit detects the difference between said first and second periods on the basis of a difference between an output timing of said delayed latch signal and a timing at which the voltage of said other part of said bit lines exceeds said threshold voltage.

11. The ferroelectric memory according to claim 10, wherein said variable delay circuit includes an early arrival decision circuit which selects read data that are earlier outputted, from the read data that are outputted from said sense amplifiers corresponding to said first and second memory cells, and outputs the selected read data to said variable delay stage at the first stage.

12. The ferroelectric memory according to claim 10, wherein said variable delay circuit includes a late arrival decision circuit which selects read data that are later outputted, from the read data that are outputted from said sense amplifiers corresponding to said first and second memory cells, and outputs the selected read data to said delay adjustment circuit.

13. The ferroelectric memory according to claim 1, wherein said read control circuit sets said predetermined time at each read operation.

14. The ferroelectric memory according to claim 1, further comprising:
a precharge circuit which precharges said bit lines to a predetermined voltage before said read operation.

15. The ferroelectric memory according to claim 1, further comprising:
a voltage generator which generates said threshold voltage.

16. A read method for a ferroelectric memory including a plurality of normal memory cells each including ferroelectric capacitor which stores data fed from an exterior, a second memory cell including a ferroelectric capacitor which stores inverted data of first data stored in a first memory cell of said normal memory cells, and bit lines individually connected with said normal memory cells and said second memory cells, comprising the steps of:
feeding an electric current to said bit lines for a predetermined period from a start of a read operation; and
deciding logic values of data which are read from said normal memory cells to said bit lines, in a read operation in a predetermined time after a voltage of any of said bit lines connected with said first and second memory cells first exceeds a threshold voltage, wherein
said predetermined time is set to be a time from when a voltage of one of said bit lines connected with said first and second memory cells exceeds a threshold voltage to when a voltage of the other one of said bit lines connected with said first and second memory cells exceeds the threshold voltage.

17. The read method for a ferroelectric memory according to claim 16, further comprising the step of:
setting said predetermined time to one half of a period from a time when a voltage of one part of said bit lines connected with said first and second memory cells exceeds said threshold voltage to a time when a voltage of the other part of said bit lines connected with said first and second memory cells exceeds said threshold voltage.

18. The read method for a ferroelectric memory according to claim 16, further comprising the steps of:
outputting latch signals after said predetermined time period; and
latching read data, that are obtained by differentially amplifying voltages of said individual bit lines and said threshold voltage, with said latch signals.

19. The read method for a ferroelectric memory according to claim 18, further comprising the steps of:
detecting a difference between a first period from the time when the voltage of one part of said bit lines connected with said first and second memory cells exceeds the threshold voltage to the time when said latch signals are outputted, and a second period from the time when said latch signals are outputted to the time when the voltage of the other part of said bit lines connected with said first and second memory cells exceeds said threshold voltage; and
outputting an adjustment signal, which reduces said difference, to said variable delay circuit.

20. The read method for a ferroelectric memory according to claim 19, further comprising the steps of:
generating said latch signal in said predetermined time after the voltage of said one of said bit lines exceeds said threshold voltage; generating a delayed latch signal delayed from said latch signal; and
detecting the difference between said first and second periods on the basis of a difference between an output timing of said delayed latch signal and a timing at which the voltage of said other of said bit lines exceeds said threshold voltage.

21. The read method for a ferroelectric memory according to claim 18, further comprising the step of:
starting a write-back operation to write data read from said memory cells back again in said memory cells, in response to said latch signal.

22. The read method for a ferroelectric memory according to claim 21, further comprising the steps of:
executing said write-back operation by driving plate lines that are individually connected with each of said ferroelectric capacitors; and
starting driving said plate lines in response to said latch signals.

23. The read method for a ferroelectric memory according to claim 16, further comprising the step of:
setting said predetermined time at each read operation.

24. The read method for a ferroelectric memory according to claim 16, further comprising the step of:
precharging said bit lines to a predetermined voltage before said read operation.

25. A read method for a ferroelectric memory including memory cells composed of ferroelectric capacitors, comprising the steps of:
storing write data as capacitances of said ferroelectric capacitors; and
applying an electric current to bit lines connected with said memory cells and deciding, while the bit lines are being charged, logic values of data stored in said memory cells according to charge times of said ferroelectric capacitors, in a read operation.

26. The read method for a ferroelectric memory according to claim 25, further comprising the step of:
deciding logical values of said data according to a length of time for voltages of said bit lines to exceed a threshold voltage.

* * * * *